United States Patent
Wu et al.

(10) Patent No.: US 9,891,740 B2
(45) Date of Patent: Feb. 13, 2018

(54) HIGH DENSITY SENSOR MODULE

(71) Applicant: HON HAI PRECISION INDUSTRY CO., LTD., New Taipei (TW)

(72) Inventors: Tsung-Ju Wu, New Taipei (TW); Jen-Tsorng Chang, New Taipei (TW); Hsin-Pei Hsieh, New Taipei (TW); Yi-Cheng Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 95 days.

(21) Appl. No.: 15/155,772

(22) Filed: May 16, 2016

(65) Prior Publication Data

US 2017/0255311 A1    Sep. 7, 2017

(30) Foreign Application Priority Data

Mar. 3, 2016   (TW) .............................. 105106449 A

(51) Int. Cl.
*G06F 3/041*   (2006.01)
*H05K 1/18*   (2006.01)

(52) U.S. Cl.
CPC .......... *G06F 3/0414* (2013.01); *H05K 1/185* (2013.01); *H05K 2201/10151* (2013.01)

(58) Field of Classification Search
None
See application file for complete search history.

(56) References Cited

U.S. PATENT DOCUMENTS

| | | | | |
|---|---|---|---|---|
| 5,543,589 | A * | 8/1996 | Buchana | ............... G06F 3/0414 178/18.03 |
| 2011/0157087 | A1* | 6/2011 | Kanehira | .............. G06F 3/0414 345/174 |

* cited by examiner

*Primary Examiner* — Jennifer Mehmood
*Assistant Examiner* — Krishna Neupane
(74) *Attorney, Agent, or Firm* — ScienBiziP, P.C.

(57) ABSTRACT

A high-density sensor module includes a substrate with a printed circuit board, a first supporting member disposed on a upper surface of the printed circuit board, the first supporting member includes at least one first sensing channel with a first right sidewall, at least one sensor disposed on the first right sidewall and electrically connected to the printed circuit board, and at least one first conductive unit arranged in the first sensing channel. The angle between the first right sidewall and the upper surface of the printed circuit board is not less than 90°. When the first conductive unit is subjected to a pressure from outsides, the first conductive unit slides along a direction toward the upper surface of the printed circuit board and presses the sensors, and the pressure is conductive from the first conductive unit to the sensor. The sensing density and sensing resolution are enhanced.

13 Claims, 6 Drawing Sheets

HIGH DENSITY SENSOR MODULE

FIELD

The subject matter herein generally relates to a high-density pressure sensor module.

BACKGROUND

In the field of industrial automation and mobile device applications, pressure sensors for touch screens are used to monitor or control user interfaces and functions of hardware device. Touch screens with pressure sensors are also broadly used in water conservancy and hydropower, railway transportation, intelligent buildings, production automation, aerospace, medical and many other industries. Accordingly, the touch screens need high density pressure sensors to increase the sensing density and resolution of the touch screen.

BRIEF DESCRIPTION OF THE DRAWINGS

Implementations of the present technology will now be described, by way of example only, with reference to the attached figures.

DETAILED DESCRIPTION

Figure 1:
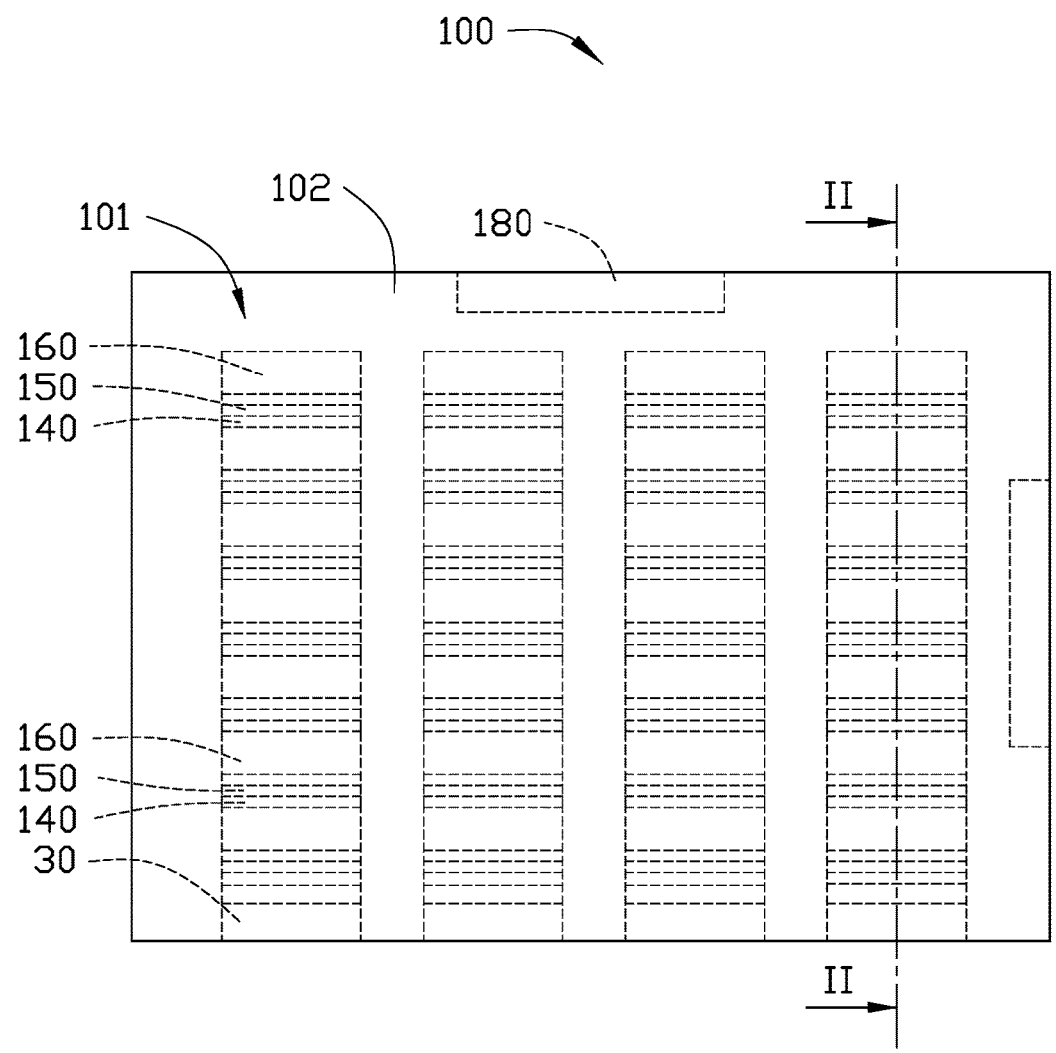
FIG. 1 is a diagrammatic plan view of the first embodiment of a high density sensor module.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a high-density sensor module 100 for use with a touch screen and which includes a sensing region 101 and a non-sensing region 102 surrounding the sensing region 101.

Figure 2:
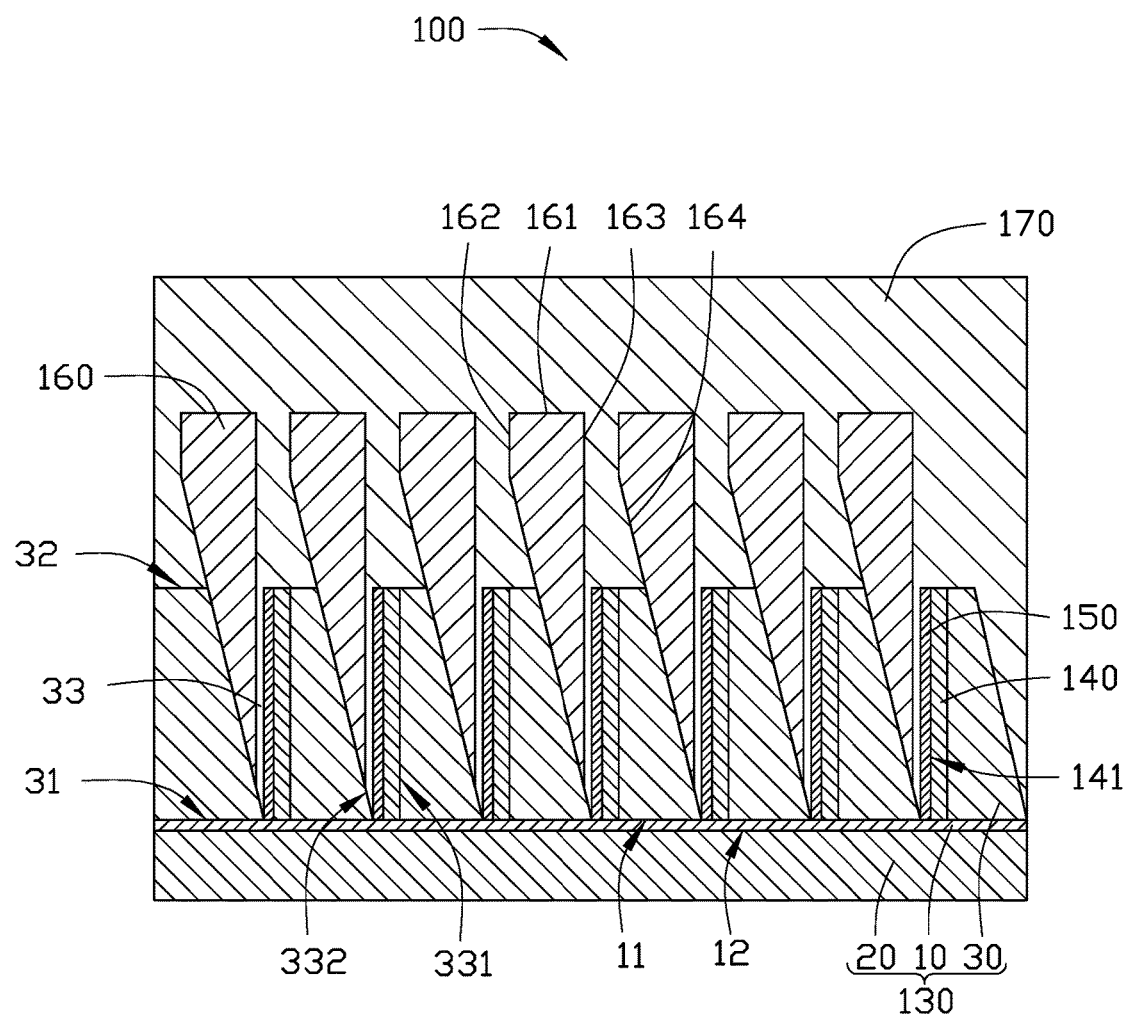
FIG. 2 is a cross-sectional view of the high density sensor module along the line II-II in FIG. 1.

FIG. 2 illustrates the sensing region 101 of the high-density sensor module 100 includes a substrate 130, a plurality of first sensors 140, a plurality of first conductive units 160, and a first packaging resin 170.

The substrate 130 includes a first printed circuit board 10, a first supporting substrate 20, and a first supporting member 30. The first printed circuit board 10 includes a first upper surface 11 and a first lower surface 12 opposite to the first upper surface 11. The first supporting substrate 20 is disposed on the first lower surface 12, and the first supporting member 30 is disposed on the first upper surface 11. The printed circuit board 10 can be a flexible printed circuit board, a rigid printed circuit board, or a rigid-flex printed circuit board.

The first supporting substrate 20 can be made of glass, metal, or plastic sheets. The first supporting substrate 20 supports the first printed circuit board 10, the first supporting member 30, the plurality of first conductive units 160, and the first packaging resin 170.

The first support member 30 is a non-elastic substrate. The material of the first support member 30 can be glass, metal or plastic. The first support member 30 supports the plurality of first conductive units 160 to fix the plurality of first sensors 140 at a specific angle.

The first supporting member 30 includes a first bottom surface 31 and a first top surface 32 opposite to the first bottom surface 31. The first bottom surface 31 is attached to and parallel with the first upper surface 11. The cross-section of the first supporting member 30 is tooth-like shaped. Each recess disposed on the first supporting member 30 forms a first sensing channel 33. A portion of the first printed circuit board 10 can be exposed from the plurality of first sensing channels 33 as the thickness of each of the plurality of first sensors 140 is thinner than the width of each of the plurality of the sensing channels 33. The cross-section for each of the plurality of first sensing channels 33 is a rectangular trapezoidal shape before the channels are each filled with the first packaging resin 170. Each of the plurality of first sensing channels 33 includes a first right sidewall 331 and a first left sidewall 332 opposite to the first right sidewall 331. The first right sidewall 331 is substantially perpendicular to the first bottom surface 31. In at least one embodiment, a first angle formed between the first right sidewall 331 and the first upper surface 11 of the printed circuit board 10 exposed from the first sensing channel 33 before filling with the first packaging resin 170 is not less than 90°. The first left sidewall 332 is oblique to the first printed circuit board 10. An angle between the portion of the first left sidewall 332 and the first printed circuit board 10 exposed from the first sensing channel 33 before filling with the first packaging resin 170 is defined as α, and α is larger than 90 degrees.

A plurality of first sensors 140 are in the form of first sensors 140 formed between each of the first right sidewalls 331. Each of the plurality of first sensors 140 is disposed on each of the first right sidewalls 331 and electrically connected to the first printed circuit board 10. In at least one embodiment, the height for each of the first sensors 140 in the direction substantially perpendicular to the first printed circuit board 10 is with the same as the height of the first supporting member 30. Each of the first sensors 140 includes a first sensing surface 141 on the surface of the first sensor 140 away from and parallel with the first right sidewall 331 and parallel to the first right sidewall 331.

The high-density sensor module 100 further includes a first buffer layer 150 disposed on the first sensing surface 141 of each of the first sensors 140. The first buffer layer 150 is mainly used to protect the first sensor 140 and conducts the pressure from the first conductive unit 160 to the first sensor 140.

The material of the first buffer layer 150 is selected from for example one of thermoplastic polyurethane (TPU), polydimethylsiloxane (PDMS), silicone, or rubber.

Each of the first conductive units 160 can be wedge-shaped. The first conductive unit 160 includes a first top conductive surface 161, a first left-side surface 162, and a first right-side surface 163 opposite to the first left-side surface 162, and a first oblique surface 164 connecting between the first left-side surface 162 and the first right-side surface 163. The first top conductive surface 161 is parallel to the first top surface 32. The angle between first right-side surface 163 and the first oblique surface 164 is an acute angle. The first oblique surface 164 is respect to the first left sidewall 332. When the high-density sensor module 100 is subject to an external force, the first oblique surface 164 can slide along the first left sidewall 332 toward the first upper surface 11 of the first printed circuit board 10.

The first packaging resin 170 is disposed on the first upper surface 11 of the first printed circuit board 10 and covers the first supporting member 30 and the plurality of first conductive units 160. In at least one embodiment, the first packaging resin 170 is formed by injection molding. The first packaging resin 170 can be a flexible or elastic material. In at least one embodiment, the material of the first packaging resin 170 is a colloid. The first packaging resin 170 protects the sensor 140 from being subject to outside interferences or damages, thereby extending the life cycle of the first sensor 140.

In at least one embodiment, the first sensor 140, the first buffer layer 150, the plurality of first conductive units 160 and corresponding portion of the substrate 130, and a first portion of the packaging resin 170 form the sensing region 101. A second portion of the first packaging resin 170 and the portion of the substrate 130 surrounding the sensing region 101 form the non-sensing region 102.

The high-density sensor module 100 further includes at least one connection portion 180 located within the non-sensing region 102. The connection portion 180 and the first printed circuit board 10 are electrically connected. In at least one embodiment, the connection portion 180 further includes an interface (not shown) exposed to outside of the high-density sensor module 100. The connection portion 180 is used to output the signals sensed by the first sensors 140.

Figure 3:
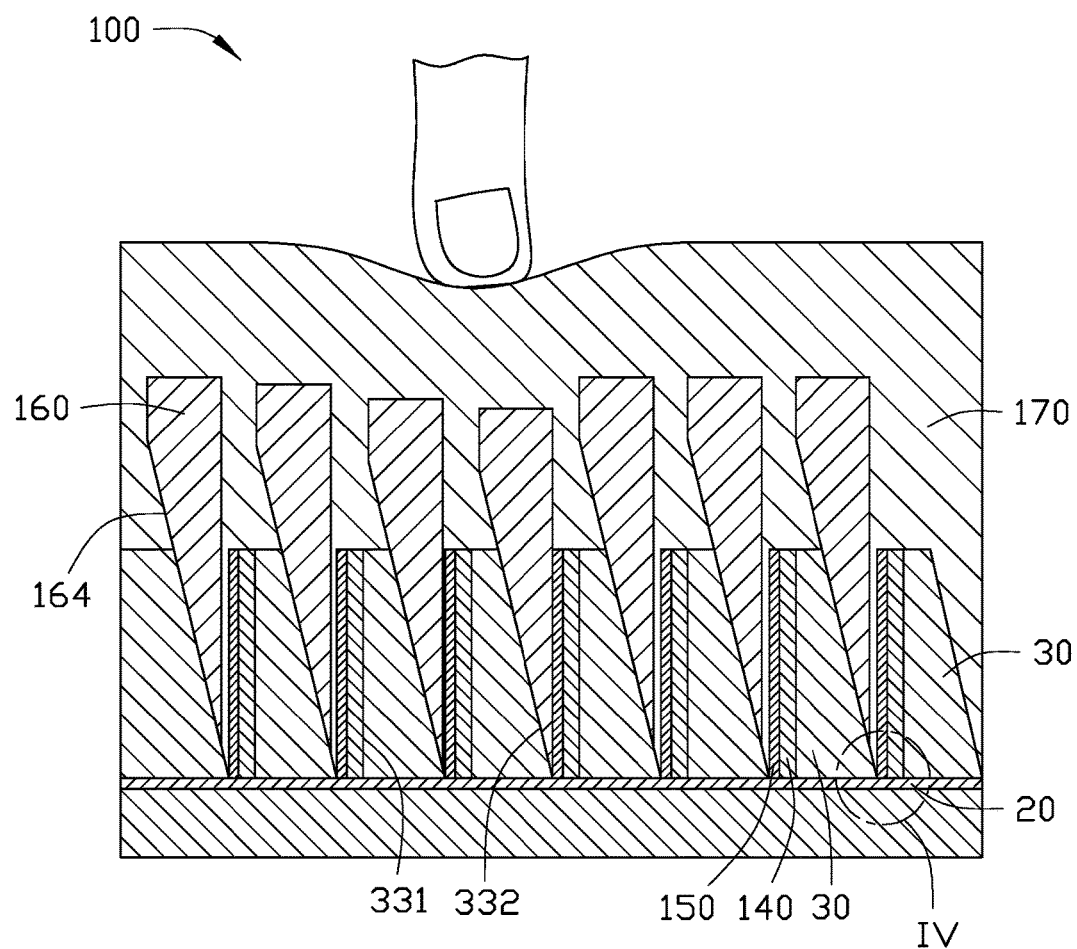
FIG. 3 is a cross-sectional view of the high-density sensor module in FIG. 1 being pressed by a finger.
Figure 4:
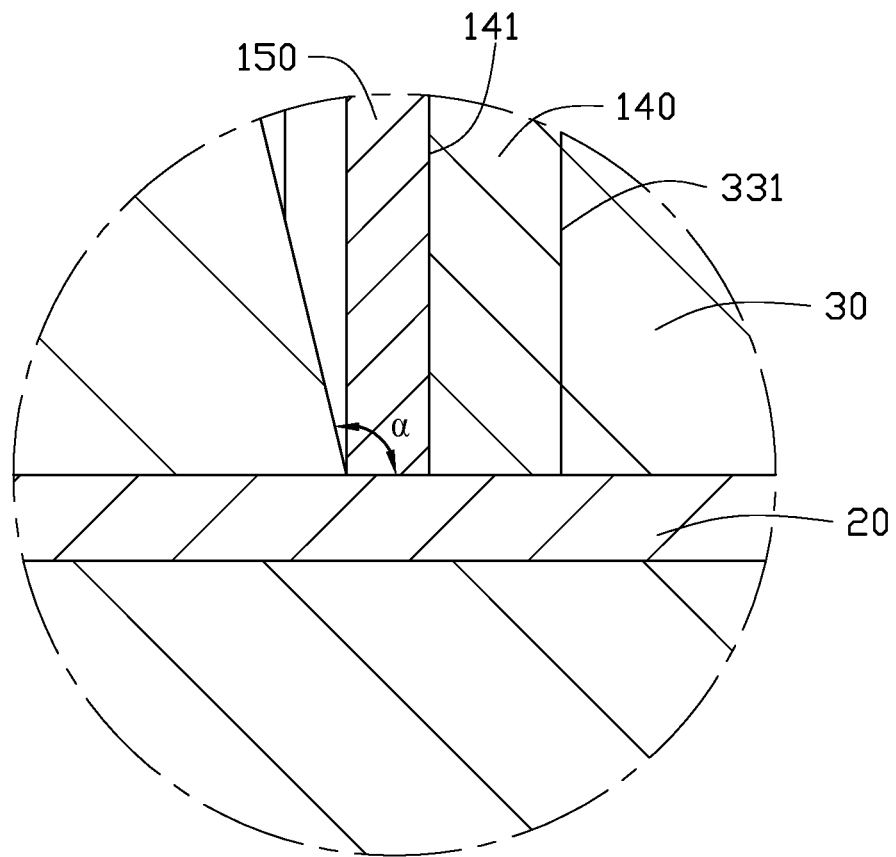
FIG. 4 is a cross-sectional view of the local area IV of the high-density sensor module in FIG. 3.

FIG. 3 and FIG. 4 illustrate the high-density sensor module 100 experiencing the force of an external contact. When the high-density sensor module 100 experiences an external positive pressure, one or more of the first conductive units 160 are pushed by the first left sidewall 332 to slide along the first left sidewall 332 to make the connection between the first left-side surface 162 and the first buffer layer 150. And then, the first sensor 140 receives the pressure conducted from the first conductive unit 160. The first sensor 140 converts the sensed pressure into electrical or other forms of signal according to certain rules, and outputs the electrical or other forms of signal through the connection portion 180 of the high-density sensor module 100. Because a determined relation between the amount of the pressure sensed by the first sensor 140 and the external applied positive pressure is defined, the amount of the external applied positive pressure can be calculated through the amount of the pressure sensed by the first sensor 140.

Figure 5:
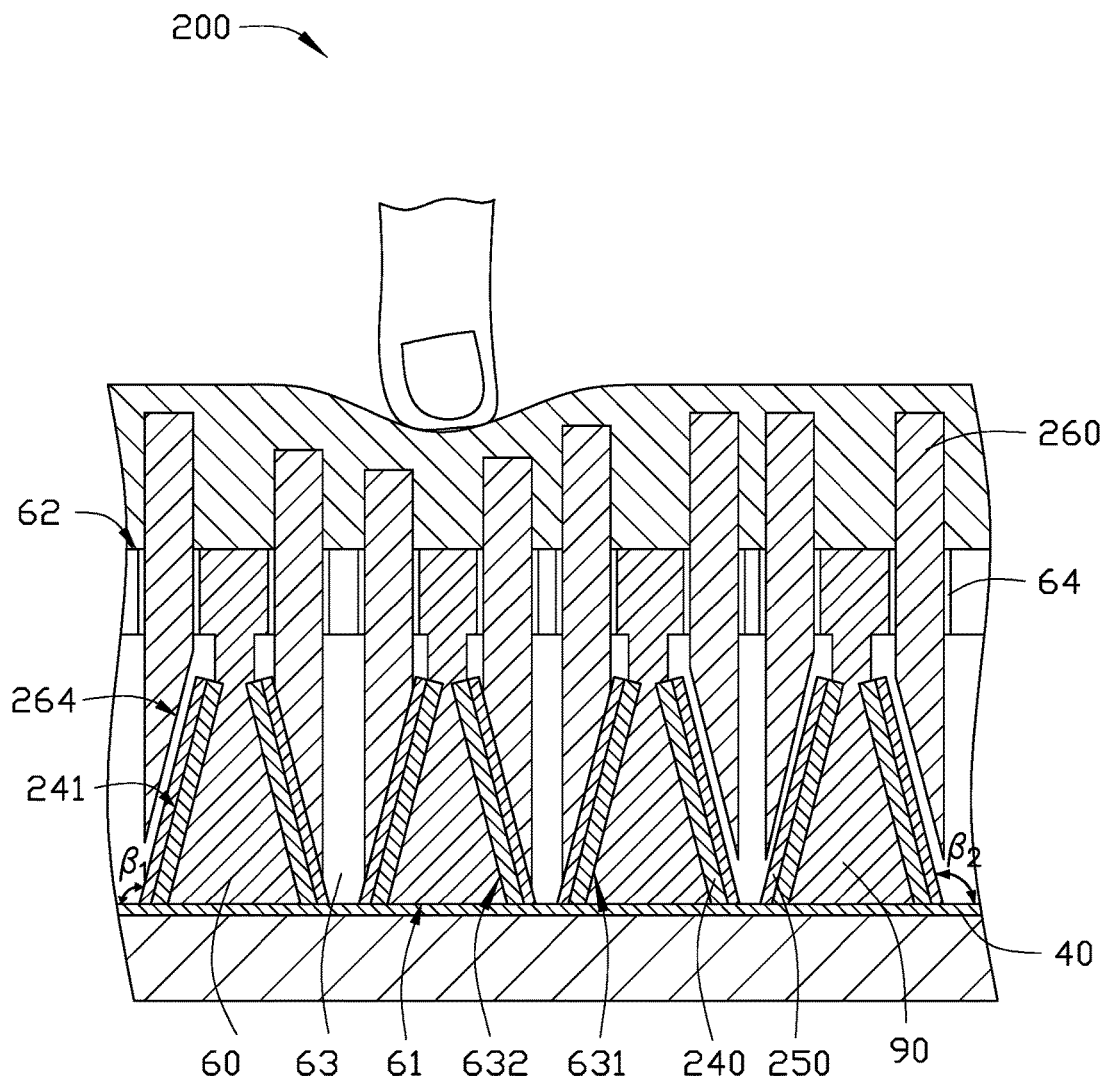
FIG. 5 is a cross-sectional view of the high-density sensor module of the second embodiment being pressed by a finger.

FIG. 5 illustrates a high-density sensor module 200 as a second embodiment of the present invention. The high-density sensor module 200 is substantially has the same structure as the high-density sensor module 100. The difference between the first and second embodiments is that the high-density sensor module 200 has a second supporting member 60 which is different from the first supporting member 30 of the high-density sensor module 100.

The second supporting member 60 of the high-density sensor module 200 includes a second bottom surface 61 and a second top surface 62 opposite to the second bottom surface 61. A plurality of second openings 64 and second sensing channels 63 are formed between the second bottom surface 61 and the second top surface 62. Each of second sensing channels 63 is corresponding to two second openings 64. Each of the second sensing channels 63 communicates with the two corresponding second openings 64. The high-density sensor module 200 includes a second printed circuit board 40. A portion of the second printed circuit board 40 is exposed from the second sensing channels 63.

The shape of cross section for each of the second sensing channels 63 is substantially non-rectangular trapezoid. Each of the second sensing channels 63 includes a second right sidewall 631 and a second left sidewall 632 opposite to the second right sidewall 631. The second right sidewall 631 and the second left sidewall 632 are tilted at an angle with respect to the second printed circuit board 40. The angles for the second right sidewall 631 and the second left sidewall 632 with respect to the portion of the second printed circuit board 40 exposed from the second sensing channels 63 are $\beta1$ and $\beta2$, respectively. The angle of $\beta1$ is larger than 90° and the angle of $\beta2$ is also larger than 90°. In at least one embodiment, $\beta1$ is equal to $\beta2$. The second right sidewall 631 and the second left sidewall 632 are both disposed with a second sensor 240 for the high-density sensor module 200. Each of the sensors 240 includes a second sensing surface 241.

Each of the second openings 64 is located above the second right sidewall 631 or the second left sidewall 632 of the corresponding second sensing channel 63. In addition, each of the openings 64 accommodates a corresponding second conductive unit 260 of the high-density sensor module 200. The dimension of the second opening 64 parallel to the direction of the second top surface 62 is equal to or slightly greater than a dimension of the corresponding second conductive unit 260, thus the second opening 64 limits the second conductive unit 260 only to slide along a direction perpendicular to the second top surface 62. Each of the second conductive units 260 includes a second oblique surface 264. The second oblique surfaces 264 of the two conductive units 260 accommodated in the adjacent second openings 64 are respectively opposite to the two second sensing surfaces 241 of the second sensors 240 disposed on the second right sidewall 631 and the second left sidewall 632.

The high-density sensor module 200 includes a plurality of second buffer layers 250. Each of the second buffer layers 250 is located between the second oblique surface 264 of the second conductive unit 260 and the second sensing surface 241 of the corresponding second sensor 240. In addition, each of the second buffer layers 250 is fixed on the second sensing surface 241 of the corresponding second sensor 240, which is used to protect the second sensor 240 and to conduct the pressure from the second conductive unit 260 to the second sensor 240.

In this sense each side of the sensor 241 and 240 are also formed between the inclined surface 264 of the second conductive unit 260 has a buffer layer 250. The buffer layer 250 is fixed to the sensing surface 241, which is used to protect the pressure sensor 240 and from the second conductive unit 260 is conducted to the sensor 240.

In the second embodiment, when the high-density sensor module 200 is experienced with a positive pressure from outside, the second conductive unit 260 will slide along the direction substantially perpendicular to the second top surface 62. The second conductive unit 260 presses the second buffer layer 250, and then the pressure from the second conductive unit 260 is conducted to the second sensor 240. After the second sensor 240 receives the pressure, the sensed pressure signal is converted into electrical or other forms of signal according to certain rules, and then the electrical or other forms of signal is output by the connection portion (not shown) of the high-density sensor module 200. Because there is a corresponding relationship between the amount of the pressure sensed by the second sensor 240 and the external positive pressure applied from outsides, the external positive pressure can be calculated by the amount of the pressure sensed by the second sensor 240.

Figure 6:
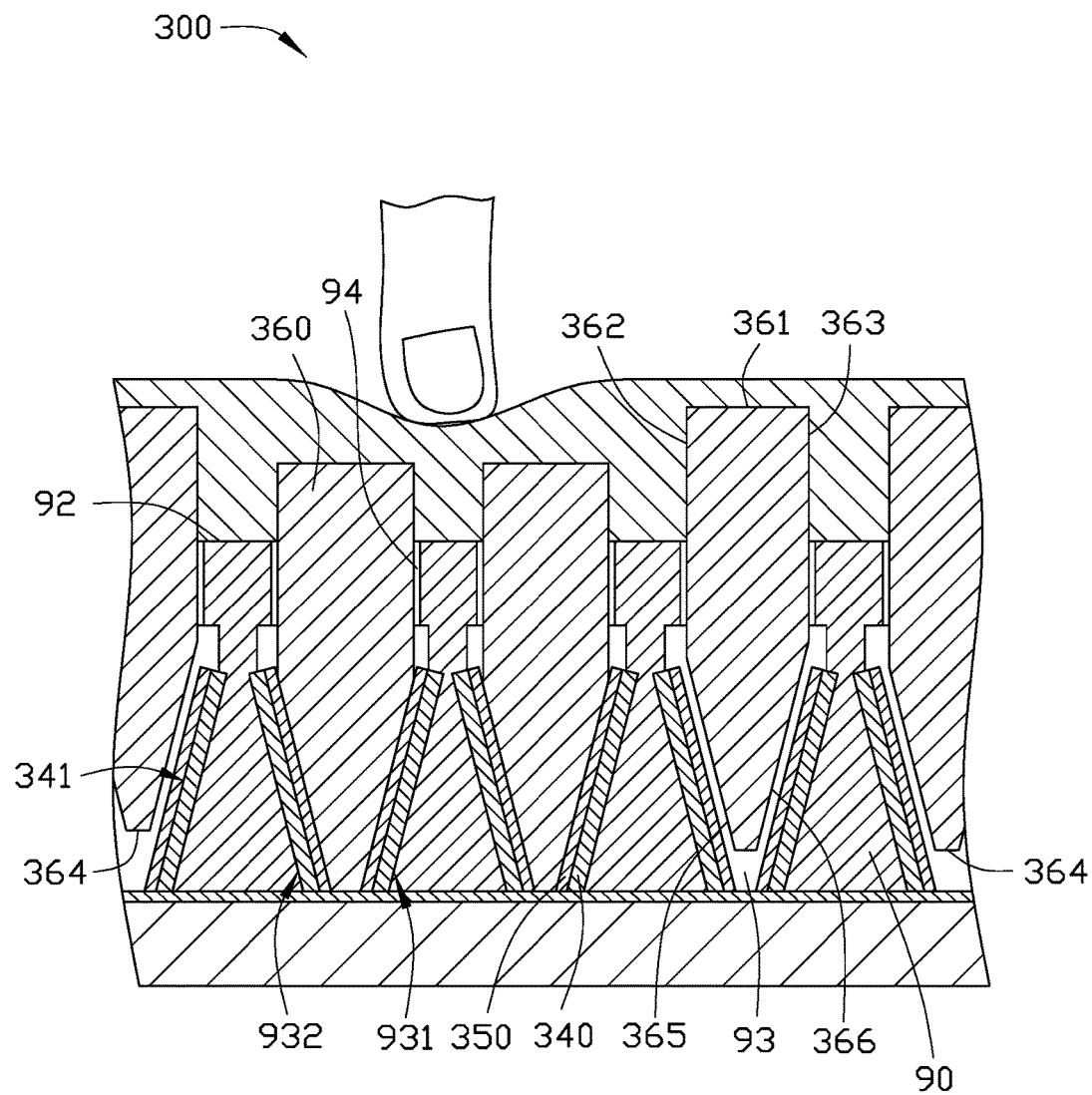
FIG. 6 is a cross-sectional view of the high-density sensor module of the third embodiment being pressed by a finger.

FIG. 6 illustrates a high-density sensor module 300 as a third embodiment of the present invention. The high-density sensor module 300 has a substantially same structure as the high-density sensor module 200 of the second embodiment. The high-density sensor module 300 includes a third supporting member 90 with a third top surface 92. The third supporting member 90 further includes at least one third sensing channel 93 and at least one third opening 94. Each of the openings 94 is respectively corresponding to each of a third sensing channel 93. The third sensing channel 93 includes a third right sidewall 931 and a third left sidewall 932. The third right sidewall 931 and the third left sidewall 932 are both formed with a third sensor 340. Each of the third sensors 340 includes a third sensing surface 341. The high-density sensor module 300 includes a plurality of third conductive units 360. Each of the third conductive units 360 includes a third top conductive surface 361, a third left-side surface 362 perpendicular to the third top conductive surface 361, a third right-side surface 363 opposite to the third left-side surface 362, a third bottom surface 364 opposite to the third top conductive surface 361, a third left oblique surface 365 connecting between the third left-side surface 362 and the third bottom surface 364, and a third right oblique surface 366 connecting between the third right-side surface 363 and the third bottom surface 364. The third left oblique surface 365 and the third right oblique surface 366 are respectively opposite to the third sensing surfaces 341 of the third sensors 340 formed on the third left sidewall 932 and the third right sidewall 931.

In the third embodiment, when the high-density sensor module 300 is experienced with a positive pressure from outside, the third conductive unit 360 slides along the direction perpendicular to the third top surface 92. The third conductive unit 360 presses the third buffer layer 350, and then the pressure from the third conductive unit 360 is conducted from the third conductive unit 360 to the corresponding two third sensors 340. After the corresponding two third sensors 340 receive the pressure, the sensed pressure signal is converted into electrical or other forms of signal according to certain rules, and then the electrical or other forms of signal is output by the connection portion (not shown) of the high-density sensor module 300. Because there is a corresponding relationship between the amounts of the pressure sensed by the corresponding two third sensors 340 and the external positive pressure applied from outsides, the external positive pressure can be calculated by the amounts of the pressure sensed by the corresponding two third sensors 340.

In the above embodiments of high-density sensor modules, the first supporting member 30, the second supporting member 60, and the third supporting member 90 have different shapes, but they are all used as a supporting member with one or more sensing channels. The sensing channels includes a left sidewall and a right sidewalls, and a plurality of sensors are disposed on the right sidewall and/or the left sidewall. All of the first conductive unit, the second conductive unit, and the third conductive unit are all used as a conductive unit to conductive the pressure to the corresponding sensor and have different shapes. Because the right sidewall and/or the left sidewall are perpendicular to or oblique to the printed circuit board of the high density sensor module, the sensing density and the sensing resolution are enhanced.

The present invention provides a high-density sensor module, the high-density sensor module includes a substrate with a supporting member, a printed circuit board and a supporting substrate. The supporting member includes a plurality of sensing channels. Each of the sensing channels includes a left sidewall and a right sidewall. The sensors are disposed on the right sidewall and/or the left sidewall of sensing channels perpendicular to the printed circuit board or oblique to the printed circuit board with a tilt angle. The distribution density and number of the sensors are increased. Thus, the sensing density and sensing resolution of the sensors are enhanced.

When the conductive units are experienced with a positive pressure, the conductive units slide along a direction perpendicular to the printed circuit board and presses the sensors, and the pressure is conducted from the conductive units to the sensors.

The embodiments shown and described above are only examples. Many details are often found in the art such as the other features of a high-density sensor module. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A high-density sensor module comprising:
   a substrate comprising a printed circuit board with a first upper surface;
   a supporting member disposed on the first upper surface of the printed circuit board, the supporting member comprises at least one sensing channel with a first right sidewall and a first left sidewall, the printed circuit board is partially exposed from the at least one sensing channel, wherein a first angle formed between the first right sidewall and the first upper surface of the printed circuit board exposed from the at least one sensing channel is not less than 90°;
   at least one first sensor disposed on the first right sidewall of the at least one sensing channel, the at least one first sensor comprises a first sensing surface and is electrically connected to the printed circuit board; and
   at least one conductive unit having at least a portion arranged slidably on the first left sidewall in the at least one sensing channel,
   wherein when the at least one conductive unit is experienced with a positive pressure, the at least one conductive unit slides along the first left sidewall toward the first upper surface of the printed circuit board and presses the at least one first sensor, and the pressure is conducted from the at least one conductive unit to the at least one first sensor.

2. The high-density sensor module of claim 1, wherein a second angle formed between the first left sidewall and the printed circuit board exposed from the at least one sensing channel is greater than 90°.

3. The high-density sensor module of claim 2, wherein the conductive unit is wedge-shaped and comprises a top conductive surface substantially parallel to the first upper surface of the printed circuit board, a first left-side surface substantially perpendicular to the first top conductive surface, a first right-side surface opposite to the first left side surface, and a first oblique surface faced to the first left sidewall of the at least one sensing channel and connecting between the first left-side surface and the first right-side surface.

4. The high-density sensor module of claim 3, wherein the high-density sensor module further comprises a first buffer layer disposed on the first sensing surface of the at least one first sensor.

5. The high-density sensor module of claim 4, wherein the high-density sensor module further comprises a second buffer layer and at least one second sensor, the at least one second sensor is disposed on the first left sidewall and faced to the first sensor, the second sensor comprises a second sensing surface, the second buffer layer is disposed on the second sensing surface, and the at least one second sensor is electrically connected to the printed circuit board.

6. The high density sensor module of claim 5, wherein the supporting member further comprises a top surface substantially parallel to the printed circuit board and face away from the printed circuit board, the supporting member further comprises at least two openings communicating the at least one sensing channel through the top surface of the supporting member, the at least two openings are respectively located above the corresponding first left sidewall and the corresponding first right sidewall, each of the at least two second openings accommodates a conductive unit, the oblique surface of each of the conductive units is faced to the first sensing surface or the second sensing surface.

7. The high-density sensor module of claim 6, wherein the first angle between the first right sidewall and the printed circuit board exposed from the sensing channel is equal to the second angle between the first left sidewall and the printed circuit board exposed from the sensing channel.

8. The high-density sensor module of claim 1, wherein a second angle formed between the first left sidewall and the printed circuit board exposed from the sensing channel is larger than 90°, the first angle formed between the first right sidewall and the printed circuit board exposed from the at least one sensing channel is also larger than 90°, a second sensor is disposed on the first left sidewalls, the second sensor comprises a second sensing surface and is electrically connected to the printed circuit board, and a second buffer layer is disposed on the second sensing surface of the second sensor.

9. The high-density sensor module of claim 8, wherein each of the conductive unit comprises a top conductive surface, a right-side surface perpendicular to the top conductive surface, a left-side surface opposite to the right-side surface, a bottom surface opposite to the top conductive surface, a right oblique surface connecting between the right-side surface and the bottom surface, and a left oblique surface connecting between the left side surface and the bottom surface, the right oblique surface and the left oblique surface are respectively faced to the first and second sensors disposed on the first right sidewall and the first left sidewall.

10. The high-density sensor module of claim 9, wherein the substrate further includes a supporting substrate formed on the printed circuit board and opposite to the supporting member.

11. The high-density sensor module of claim 9, wherein the high-density sensor module further comprises a packaging resin, the packaging resin is formed on the printed circuit board and covers the supporting member and the conductive unit.

12. A high-density sensor module comprising:
a substrate comprising
a printed circuit board with a first upper surface and a first lower surface;
a supporting member disposed on the first upper surface of the printed circuit board, the support member comprises at least one sensing channel with a first right sidewall and a first left sidewall, the first upper surface of the printed circuit board is partially exposed from the at least one sensing channel, and a first angle formed between the first right sidewall and the first upper surface of the printed circuit board is not less than 90°; and
a supporting substrate disposed on the first lower surface, the supporting substrate is used to support the printed circuit board and the supporting member;
at least one first sensor disposed on the first right sidewall of the at least one sensing channel, the at least one first sensor comprises a first sensing surface and is electrically connected to the printed circuit board; and
at least one conductive unit having at least a portion arranged in the at least one sensing channel,
wherein when the at least one first conductive unit is experienced with a positive pressure, the at least one conductive unit slides along a direction toward the first upper surface of the printed circuit board and presses the at least one first sensor, and the pressure is conducted from the at least one conductive unit to the at least one first sensor.

13. A high-density sensor module comprising:
a substrate comprising
a printed circuit board with a first upper surface and a first lower surface;
a supporting member disposed on the first upper surface of the printed circuit board, the support member comprises a plurality of sensing channels, each of the plurality of sensing channels comprises a first right sidewall and a first left sidewall, the first upper surface of the printed circuit board is partially exposed from sensing channels, and a first angle formed between the first right sidewall and the first upper surface of the printed circuit board is not less than 90°; and
a supporting substrate disposed on the first lower surface, the supporting substrate is used to support the printed circuit board and the supporting member;
a plurality of sensors respectively disposed on the corresponding first right sidewall and the first left sidewall for each of the plurality of sensing channels, each of the plurality of sensors comprises a sensing surface, and the plurality of sensors are electrically connected to the printed circuit board;
a plurality of conductive units arranged in the corresponding sensing channels; and a packaging resin disposed on the printed circuit board, the packaging resin covers the supporting member, the conductive units, and the sensors, wherein when the conductive units are experienced with a positive pressure, the conductive units slide along a direction toward the first upper surface of the printed circuit board and presses the sensors, and the pressure is conducted from the conductive units to the sensors.

* * * * *